Nov. 16, 1965 P. DOWHY 3,218,568

AMPLIFIER INCLUDING MOMENTARY GAIN INCREASING MEANS

Filed Sept. 12, 1962

INVENTOR.
PETER DOWHY

BY

George T. Craig
ATTORNEY 3,218,568

AMPLIFIER INCLUDING MOMENTARY GAIN INCREASING MEANS

Peter Dowhy, Pittsburgh, Pa., assignor to Radio Corporation of America, a corporation of Delaware Filed Sept. 12, 1962, Ser. No. 223,017
10 Claims. (Cl. 330—29)

The present invention relates to oscillators of the type stabilized by a mechanical vibratory member, and more particularly to a novel oscillator stabilized by a vibrating reed structure having provision for reducing the start-up time of the oscillator.

The electrical characteristics of resonant reed vibrators change with driving current value. More regenerative feedback is required to start the reed vibrating than to continue its vibration. A reed oscillator without variable feedback may take several seconds to reach operating vibration amplitude.

An object of the present invention is to provide novel means for accelerating initiation of oscillations in an oscillator stabilized by a mechanical vibratory member.

Another object of the present invention is to provide novel means to increase the gain of the amplifier for a brief time when the amplifier is placed in operation.

A further object of the invention is to provide a novel amplifier comprising an additional stage of amplification coupled to control degeneration in a preceding stage.

In accordance with the present invention, the output of a vibrating reed oscillator is amplified and oscillation is maintained by a regenerative feedback effect. The amplifier gain is momentarily increased when the oscillator is started. In a preferred embodiment, the gain increase is accomplished for an initial period by decreasing degeneration in a portion of a regenerative feedback loop which normally has sufficient gain to maintain oscillation during continuous operation of the oscillator amplifier.

Figure 1:
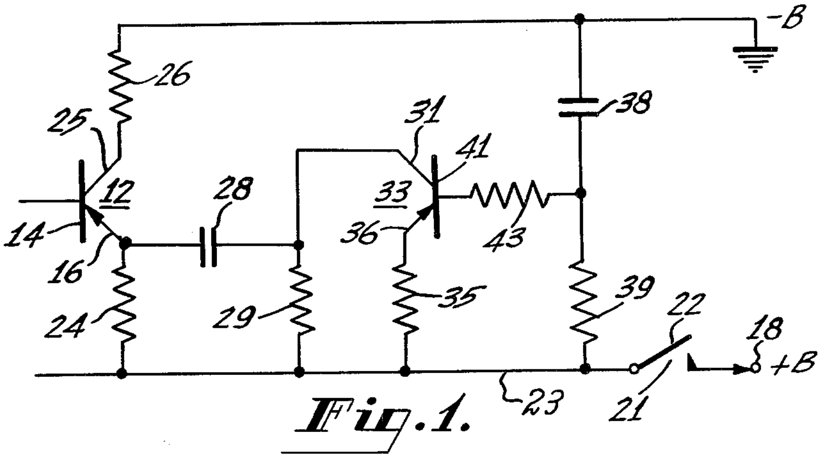
Figure 2:
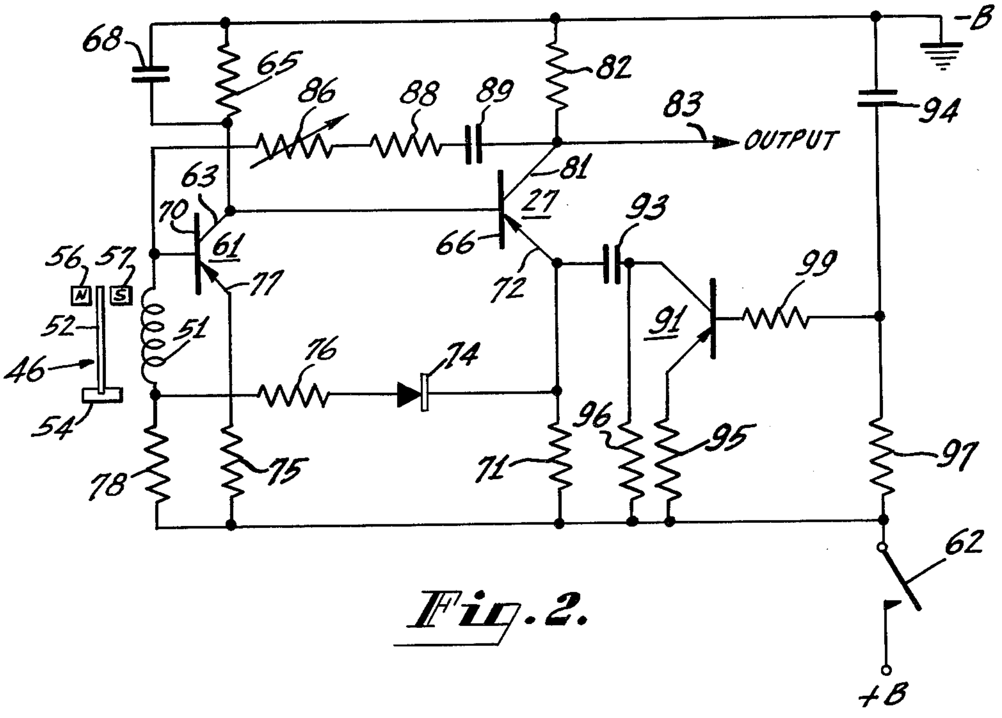

The invention will be described in greater detail by reference to the accompanying drawing in which:

FIGURE 1 is a schematic diagram of a circuit in accordance with the present invention for varying degeneration of an amplifier stage; and FIGURE 2 is a schematic diagram of a mechanically stabilized oscillator embodying the present invention.

Referring to FIGURE 1 of the drawing, an amplifier stage includes an electronic device such, for example, as a transistor 12 serving to amplify a signal applied between its base 14 and emitter 16. The transistor 12 is shown, for example, as a PNP junction device. Bias voltage for this transistor is applied to a terminal 18 by way of a switch 21, one contact 22 of which is connected to the conductor 23. The emitter 16 of the transistor is biased in the forward direction with respect to the base 14 by a connection through a resistor 24 to the conductor 23. The collector 25 of the transistor 12 is biased in the reverse direction with respect to the base by a connection through a resistor 26 to a voltage reference point in the amplifier stage such, for example, as ground. It will be understood that a connection from the positive terminal of the bias voltage source (not shown) is made to the terminal 18 and the source's negative terminal is grounded. In FIGURE 1 it will be understood that bias connections for the base with respect to the emitter and collector will be provided in a preceding stage (not shown in FIGURE 1). FIGURE 2 of the drawing shows base bias connections as well as a signal input coupling to an amplifier stage including a transistor 27 when the invention is embodied in an oscillator.

The resistor 24 ( FIGURE 1) provides degeneration in the emitter circuit of the stage including the transistor

12 and reduces its gain. This degenerative effect is modified by a capacitor 28 in series with a resistor 29. This series combination is connected in shunt to the resistor 24.

The collector 31 of a second transistor 33 is connected to the junction of the capacitor 28 and the resistor 29. The transistor 33 is shown as being a PNP junction transistor and its base and collector bias connections are operative only upon closing the switch 21 when the amplifier stage including the transistor 12 is placed in operation. A resistor 35 connects the emitter 36 to the conductor 23. A capacitor 38 and a resistor 39 are connected in series between the conductor 23 and ground. The base 41 is connected through a resistor 43 to the junction of the capacitor 38, and the resistor 39. The resistor 43 serves to control the base current drive.

In operation of the apparatus of FIGURE 1, when the switch 21 is closed, the substantially instantaneous rise in the supply voltage is differentiated by the resistor 29 and the capacitor 28 and applied to the collector 31 of the transistor 33. The circuit for rapid charge of the capacitor 28 through the resistor is completed through the emitter to collector path of the transistor 12, which is operative when the switch 21 is closed. The value of resistor 29 is larger than that of resistor 35 which provides for reverse bias of the emitter 36. The rise in supply voltage is also differentiated by the resistor 39 and the capacitor 38 to bias the base 41. Upon decrease of current through the resistors 29 and 39, the biasing voltage pulses return to zero and conduction of the transistor 33 ceases. The capacitors 28 and 38 are relatively large in value.

During the time of conduction of the transistor 33, it appears as a low impedance in the emitter circuit of the transistor 12 by shunting the resistor 29 with the emitter to collector impedance of the transistor 33 in series with resistor 35. In normal operation following the development of the pulses referred to above, emitter degeneration for alternating current is provided by the resistor 29 in series with the capacitor 28.

In FIGURE 2 the arrangement of FIGURE 1 is embodied in a resonant reed oscillator stabilized by a vibrating reed structure 46 having an inductance coil 51 and a resonant reed 52 of magnetizable material rigidly mounted at one end as indicated by the block 54. The reed 52 vibrates freely between a pair of permanent magnets 56 and 57. Transistors 27 and 91 of FIGURE 2 and their associated circuits correspond respectively to transistors 12 and 33 and their associated circuitry, as more fully pointed out hereinafter.

A transistor 61 and the transistor 27 provide a direct coupled amplifier. The bias voltage source (not shown) is connected as in FIGURE 1. A switch 62 is included in this connection. The collector 63 of the transistor 61 is connected through a load resistor 65, which serves also as the bias resistor for the base 66 of the transistor 27, to ground thereby to obtain negative bias. The resistor 65 is shunted by a capacitor 68 serving as a bypass.

Bias for the base 70 of the transistor 61 is obtained from the bias resistor 71 for the emitter 72 over a D.C. (direct current) path including a diode 74 and a resistor 76. D.C. feedback for stabilizing the operating point of the transistor 27 is obtained over this path. The coil 51 of the vibrating reed structure 46 is included in the D.C. path. Any change in the D.C. current of the transistor 27 appears at the base of the transistor 61. This change is amplified by the transistor 61 and applied to the base of transistor 27 to compensate for the change. A resistor 75 is in circuit with the emitter 77.

The A.C. voltage developed across a resistor 78 in the degenerative feedback loop from the emitter 72 of the transistor 27 stabilizes the gain of the two stage amplifier.

The resistor 78 decreases current flow in the diode 74 and therefore the diode feedback is less. By way of example, the diode 74 may be type 1N295.

The output of the oscillator appears at the collector 81 and is developed across a load resistor 82. The collector 81 is connected to the oscillator output terminal 83. The output signal is fed back regeneratively to the base 70 of the transistor 61 to sustain oscillations through a variable resistor 86 in series with a fixed resistor 88 and relatively large capacitor 89. The resistor 86 is adjusted to provide the correct regenerative voltage across the coil 51 for stable operation.

The oscillator circuit just described requires an appreciable time to reach the operating level without variable gain control provided by a transistor 91 which serves the purpose in the oscillator circuit of FIGURE 2 explained above in connection with the transistor 33 in FIGURE 1. Capacitors 93 and 94 together with resistors 96 and 97 serve the same purpose as capacitors 28 and 38, respectively, in FIGURE 1. A resistor 99 controls the base current drive and corresponds to the resistor 43 of FIGURE 1.

By way of example, the transistors shown on the drawing are type 2N408.

By way of example, the capacitors of FIGURE 2 may have the following values:

| | Mfd. |
|---|---|
| Capacitor **68** | .2 |
| Capacitor **89** | 50 |
| Capacitor **93** | 50 |
| Capacitor **94** | 50 |

Also, and by way of example, the resistors may have the following values:

| | Ohms |
|---|---|
| Resistor **65** | 3.9K |
| Resistor **71** | 1K |
| Resistor **75** | 1K |
| Resistor **76** | 1K |
| Resistor **78** | 2.2K |
| Resistor **82** | 820 |
| Resistor **86** | 25K |
| Resistor **88** | 10K |
| Resistor **95** | 62 |
| Resistor **96** | 150 |
| Resistor **97** | 4.7K |
| Resistor **99** | 8.2K |

These values are given solely by way of example in connection with an embodiment in accordance with the present invention.

What is claimed is:

1. An amplifier comprising an electronic amplifying device having degenerative feedback means limiting gain to a normal value, and means operable upon placing said amplifier in operation to initially and momentarily decrease the effect of said feedback means to thereby increase the normal gain of said amplifier prior to subsequent operation with normal gain.

2. An amplifier including an electronic device having degenerative feedback means limiting gain to a normal value, connections for a source of energizing potential for said device, and means including a resistor and capacitor network connected to said amplifier and responsive to the initial application of said potential to said device to initially and momentarily decrease the effect of said feedback means to thereby increase the normal gain of said amplifier prior to subsequent operation with normal gain.

3. An amplifier including an electronic device, connections for a source of energizing potential for said device, and means including a differentiating network connected to said amplifier and responsive to the initial application of said potential to said device to momentarily increase the normal gain of said amplifier prior to subsequent operation with normal gain.

4. An amplifier comprising a first semiconductor device having an input electrode, an output electrode and a common electrode, a signal input connection to said input electrode, degenerative means coupled to said common electrode, a second semiconductor device having an input electrode, an output electrode and a common electrode, means coupling said common electrode of said first semiconductor device and said degenerative means to said output electrode of said second semiconductor device and operable upon placing said amplifier in operation to cause said second semiconductor device to momentarily provide a conductive path between its common and output electrodes whereby to reduce the effect of said degenerative means to momentarily increase the gain of said amplifier prior to subsequent operation with normal gain.

5. An amplifier comprising a first semiconductor device having an input electrode, an output electrode and a common electrode, a signal input connection to said input electrode, degenerative means coupled to said common electrode, a second semiconductor device having an input electrode, an output electrode and a common electrode, means including a resistor and capacitor network coupling said common electrode of said first semiconductor device and said degenerative means to said output electrode of said second semiconductor device, and means operable upon placing said amplifier in operation to cause said second electronic device to momentarily provide a conductive path between its common and output electrodes whereby to momentarily reduce the effect of said degenerative means to increase the gain of said amplifier prior to subsequent operation with normal gain.

6. An amplifier comprising a semiconductor device having an input electrode, an output electrode and a common electrode, a signal input connection to said input electrode, a resistor coupled to said common electrode to provide degeneration, a second semiconductor device having an input electrode, an output electrode and a common electrode, a series combination of a capacitor and a resistor in parallel with said first named resistor, a connection from the junction of said capacitor and said second named resistor to said output electrode of said second semiconductor device, a third resistor coupled to said second device common electrode and the connected ends of said first and second resistors whereby said second electronic device provides a conductive path between its common and output electrodes, and means to energize said second device for a short time interval when said amplifier is placed in operation to shunt said second named resistor whereby to reduce degeneration and increase the gain of said amplifier during said short time interval and prior to normal operation.

7. An amplifier comprising an electronic device having an input electrode, an output electrode and a common electrode, means to apply signals to said input electrode, an output connection from said output electrode, degenerative means coupled to said common electrode, a second electronic device having an input electrode, an output electrode and a common electrode, means including a switch to supply operating bias potentials to said electrodes of said first and second electronic devices, circuit means including a first differentiating means coupling the impedance between said output electrode and said common electrode of said second electronic device across said degenerative means, a second differentiating means connected across said means to supply bias potentials to said electrodes, a connection from said second differentiating means to said input electrode of said second named electronic device, said second named electronic device becoming momentarily operative from operating potentials derived from both said differentiating means upon closure of said switch to place said amplifier in operation whereby to momentarily shunt said degenerative means prior to subsequent operation of said amplifier with the degenerative effect of said degenerative means.

8. An amplifier comprising an electronic device having an input electrode, an output electrode and a common electrode, means to apply signals to said input electrode, an output connection from said output electrode, degenerative means comprising a resistor coupled to said common electrode, differentiating means comprising a resistor and capacitor connected in series across said degenerative resistor, a second electronic device having an input electrode, an output electrode and a common electrode, means including a switch to supply operating bias potentials to said electrodes of said first and second electronic devices, circuit means coupling the impedance between said output electrode and said common electrode of said second electronic device across said second named resistor, a second differentiating means connected across said means to supply bias potentials to said electrodes, a connection from said differentiating means to said input electrode of said second electronic device, said second electronic device becoming momentarily operative from operating potentials derived from both said differentiating means upon closure of said switch to place said amplifier in operation whereby momentarily to shunt said degenerative means prior to subsequent operation of said amplifier with the degenerative effect of said degenerative means.

9. An oscillator stabilized by a mechanical vibratory member comprising an amplifier, a coil associated with said vibratory member, means coupling said amplifier to said coil whereby to sustain vibrations of said member at a substantially constant frequency and to maintain substantially constant output frequency from said amplifier, said amplifier comprising an electronic device, and means operable upon placing said amplifier in operation to initially and momentarily decrease the effect of said feedback means to thereby increase the normal gain of said amplifier prior to subsequent operation with normal gain whereby to decrease the starting time of said oscillator.

10. An oscillator stabilized by a mechanical vibratory member comprising a two stage direct current coupled amplifier, the second stage of said amplifier comprising a first semiconductor device having an input electrode, an output electrode and a common electrode, a coil associated with said vibratory member, means coupling said amplifier to said coil whereby to sustain vibrations of said vibratory member at a substantially constant frequency and to maintain a substantially constant output frequency from said amplifier, degenerative means connected to said common electrode, a second semiconducer device having an input electrode, an output electrode and a common electrode, means including a resistor and capacitor network coupling said common electrode of said first semiconductor device and said degenerative means to the output electrode of said second semiconductor device and operable upon placing said oscillator in operation to cause said second electronic device to momentarily provide a conductive path between its common and output electrodes whereby to reduce the effect of said degenerative means on said second stage and momentarily increase the driving effect on said vibratory member prior to normal operation of said oscillator.

References Cited by the Examiner

UNITED STATES PATENTS

| | | | |
|---|---|---|---|
| 2,544,340 | 3/1951 | Maxwell | 330—141 X |
| 2,610,260 | 9/1952 | Moffett | 330—142 X |
| 3,082,329 | 3/1963 | Meyer et al. | |
| 3,085,244 | 4/1963 | Kay | 330—142 X |

FOREIGN PATENTS

| | | |
|---|---|---|
| 801,455 | 9/1958 | Great Britain. |

OTHER REFERENCES

Sheridan et al.: Tuning Fork Oscillator, March 12, 1958, RCA TN No. 133.

ROY LAKE, *Primary Examiner.*

NATHAN KAUFMAN, *Examiner.*